United States Patent
Clapp et al.

(10) Patent No.: US 6,433,714 B1
(45) Date of Patent: Aug. 13, 2002

(54) APPARATUS AND METHOD FOR PRECISION TRIMMING OF A SEMICONDUCTOR DEVICE

(75) Inventors: John S. Clapp, Wyomissing; Glen A. Johnson, Reading; Douglas Baird Lebo, Birdsboro; Lawrence Peter Swanson, Fleetwood, all of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/746,724

(22) Filed: Dec. 20, 2000

(51) Int. Cl.[7] .............................................. H03M 1/10
(52) U.S. Cl. ...................................... 341/121; 341/144
(58) Field of Search ................................ 341/121, 141, 341/133, 144, 118

(56) References Cited

U.S. PATENT DOCUMENTS

| | | | | |
|---|---|---|---|---|
| 4,335,371 A | * | 6/1982 | Connolly, Jr. et al. | 341/121 |
| 5,838,076 A | * | 11/1998 | Zarrabian et al. | 307/115 |
| 6,031,672 A | * | 2/2000 | Bergquist et al. | 360/46 |
| 6,232,904 B1 | * | 5/2001 | Hartmann et al. | 341/145 |
| 6,307,490 B1 | * | 10/2001 | Liftin et al. | 341/121 |

* cited by examiner

Primary Examiner—Peguy JeanPierre
(74) Attorney, Agent, or Firm—Ryan, Mason & Lewis, LLP

(57) ABSTRACT

The present invention provides methods and apparatus for trimming semiconductor devices and circuits, such as pin electronics circuits used in automated test equipment (ATE) systems and the like, without requiring a laser trimming operation. In a preferred embodiment, the present invention addresses the need to precisely adjust a reference current and/or voltage by replacing a conventional current/voltage reference source with a digital-to-analog (D/A) converter. A select switch or mechanism is preferably coupled to the input of the D/A converter and operatively presents a digital input word to the D/A converter by selectively reading the digital word from at least one of a data register and a fuse register. The data register is preferably used during testing of the overall current or voltage reference by iteratively trying various digital input codes while concurrently measuring the analog output signal from the D/A converter until the output signal sufficiently matches a predetermined output value. The fuse register, which comprises a plurality of fusible links, is then preferably blown to permanently store the input code word that provides the desired reference output. During normal operation of the circuit, the select switch preferably reads the D/A converter input word from the fuse register. In this manner, a precise output reference signal is achieved without the need for laser trimming.

13 Claims, 3 Drawing Sheets

APPARATUS AND METHOD FOR PRECISION TRIMMING OF A SEMICONDUCTOR DEVICE

FIELD OF THE INVENTION

The present invention relates generally to precision trimming of semiconductor devices, and more specifically relates to semiconductor precision trimming methods and apparatus without requiring a laser for the trimming operation.

BACKGROUND OF THE INVENTION

Apparatus and methods for precision trimming of semiconductor or thin film devices and circuits are well known in the art. Trimming is often necessary since the absolute-value tolerances associated with such semiconductor or thin film devices are not acceptable, after fabrication, to meet a given design tolerance. Trimming techniques that are known by those skilled in the art include, for example, oxidation, where by heating certain resistor films in an oxidizing atmosphere, some of the material on the film surface is converted to a nonconductive oxide layer to increase the total resistance value, and annealing, which causes the grain structure of a device to reorient itself in a more dense fashion thereby reducing the sheet resistance of the device. Another common trimming method employs narrow fusible links between prearranged segments or taps of a component, such as a resistor. These links are typically formed of metal (e.g., aluminum) and initially short-circuit all taps together, but they can be selectively open-circuited by burning them out, either by external means (e.g., laser) or internal means, for example by passing an excessive amount of current through the particular link(s) to be blown.

One application which highlights the importance of precision trimming is the present manufacture of pin electronics used in automated test equipment (ATE) systems and the like, which rely primarily on laser trimming methods and apparatus to meet necessarily precise design performance specifications. Driver circuits utilized in pin electronics, for example, are required to have well-defined output slew rates (i.e., the rate of change of a signal), and because process variations are too great to accurately predict the absolute value of a given reference signal, laser trimming is commonly used. Laser trimming, however, has several inherent disadvantages which make its use undesirable. For instance, laser trimming is relatively slow, due at least in part to the mechanical positioning of the laser during trimming operations. Furthermore, extra mask levels or process steps are typically required in order to fabricate a laser-trimmable component, such as a thin film resistor, thus adding to the fabrication costs and reducing yield. Additionally, since laser trimming is done prior to packaging, any variations due to the packaging process itself cannot be easily corrected.

By way of example, FIG. 1A illustrates a simple pin electronics driver circuit for use in an automated test system. As understood by those skilled in the art, if a current sink 102 and a current source 104, I1 and I2, respectively, are ideal, the rate of change of output voltage, or slew rate (dv/dt), may be easily calculated as $$\frac{dv}{dt} = \frac{i}{C},$$

where C is the value of an output ramp-generating capacitor 106 (in Farads) and i is the current value (either I1 or I2, in Amperes) flowing through capacitor 106. Therefore, assuming that the value, C, of capacitor 106 can be accurately defined, the output slew rate (dv/dt) can be accurately predicted.

The pin electronics circuit may also include a switch mechanism 110, or equivalent means, to selectively connect the capacitor 106 to either the current sink 102 (I1) or current source 104 (I2), thereby generating a negative or a positive slew of the output voltage, respectively. An output buffer 108 is also generally connected to the capacitor 106 to provide a low impedance output node, as well as to provide isolation for the high impedance capacitance node 107.

A conventional bipolar junction transistor (BJT) implementation of the current sink 102 is depicted in FIG. 1B. With reference to FIG. 1B, the conventional current sink 102 includes an operational amplifier (op amp) 116 operatively connected in a unity gain closed-loop feedback configuration, with the output 118 of the op amp 116 coupled to the base of a BJT device 112, configured as an emitter follower, and the inverting (−) input 120 of the op amp 116 coupled to the junction of the emitter of the BJT device 112 and a reference resistor 114, which is typically a thin film laser-trimmable resistor. It is well known that the op amp 116 will control the current i by attempting to hold the voltage at the inverting input 120 essentially equal to the voltage at the non-inverting (+) input 122 of the op amp 116. This, in turn, substantially fixes the input voltage +V across the resistor 114. The current i is then adjusted by trimming the resistance R of resistor 114 until a desired current value is obtained. As stated above, as long as the current source 104 and sink 102 are precisely defined, the output voltage slew rate can be accurately predicted and controlled. The adjustment of the resistor value R is conventionally performed by laser trimming.

Conventional means of trimming pin electronics systems do not address the above problems. Accordingly, there is a need in the field of precision semiconductor trimming for a technique that provides quick, easy and accurate adjustment of a semiconductor device or circuit in a cost effective manner, without the need for additional process steps in the fabrication thereof. Furthermore, it would be desirable if such precision trimming capability could be provided after the packaging of the device has been completed.

SUMMARY OF THE INVENTION

The present invention provides a method and apparatus for trimming semiconductor devices and circuits, such as pin electronics, which does not employ a laser for the adjustment process. By eliminating the laser trimming operation, the present invention is a cost-effective means of quickly, easily and accurately adjusting a semiconductor device. Moreover, the present invention does not require fabrication of a laser-trimmable component, such as a thin film resistor, that typically requires additional fabrication process steps which can result in a diminished yield. Furthermore, the trimming capability may be provided after completion of the packaging of the device.

In accordance with one embodiment, the present invention addresses the need to precisely adjust a reference voltage or current source by replacing the traditional voltage or current source with a programmable voltage or current source, respectively. In a preferred pin electronics circuit application formed in accordance with the present invention, the conventional current source and sink are preferably replaced by a pair of programmable digital-to-analog (D/A) converters. Each D/A converter is operatively coupled to a select switch or mechanism, such as a multiplexer or suitable equivalent thereof, for selectively connecting the input of the D/A converter to at least one of a data register and a fuse register. The data register is used to temporarily store a digital code word during a first mode of operation of the circuit, preferably a test mode. The fuse register is used to permanently store a desired digital code word when the circuit is in a second mode of operation, preferably a normal mode.

During the test mode of operation, the analog output from the D/A converter is preferably measured while concurrently changing the input digital word stored in the data register. Once the analog output signal is measured to be substantially equal to a predetermined value for the D/A converter output, the digital code word stored in the data register, which corresponds to the desired output, is transferred to the fuse register, which includes a plurality of fusible links, for permanently storing the digital input word to the D/A converter. The digital word is preferably stored in the fuse register by selectively blowing one or more of the fusible links in order to generate the desired digital input word. During normal operation of the circuit, the select switch preferably connects the fuse register to the input of the D/A converter for generating the desired analog output signal.

These and other objects, features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention will be described herein in the context of a preferred pin electronics driver circuit for providing precision trimming or adjustment of an output voltage slew rate. It should be appreciated, however, that the methods and apparatus of the present invention have wide applicability for the precision trimming of semiconductor devices and/or circuits in general, especially those circuits including a reference current and/or voltage source requiring a precisely defined output. This includes, for example, precision timer circuits, oscillators, analog-to-digital converters, digital-to-analog converters and the like, where laser trimming methods are typically utilized to accurately adjust the absolute value of a reference current or voltage.

Figure 2:
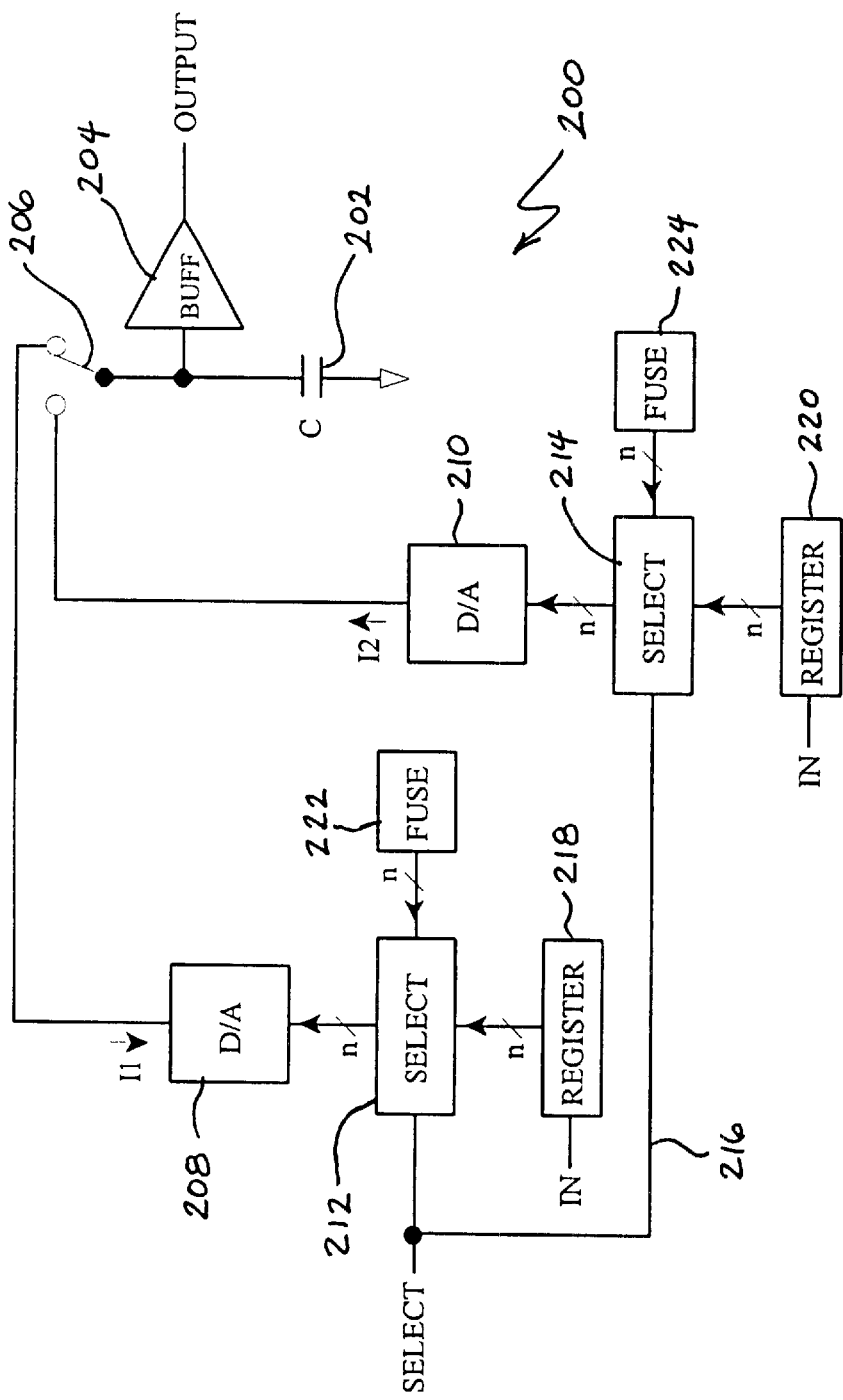
FIG. 2 is an electrical block diagram illustrating a pin electronics driver circuit formed in accordance with a preferred embodiment of the present invention.
Figure 1A:
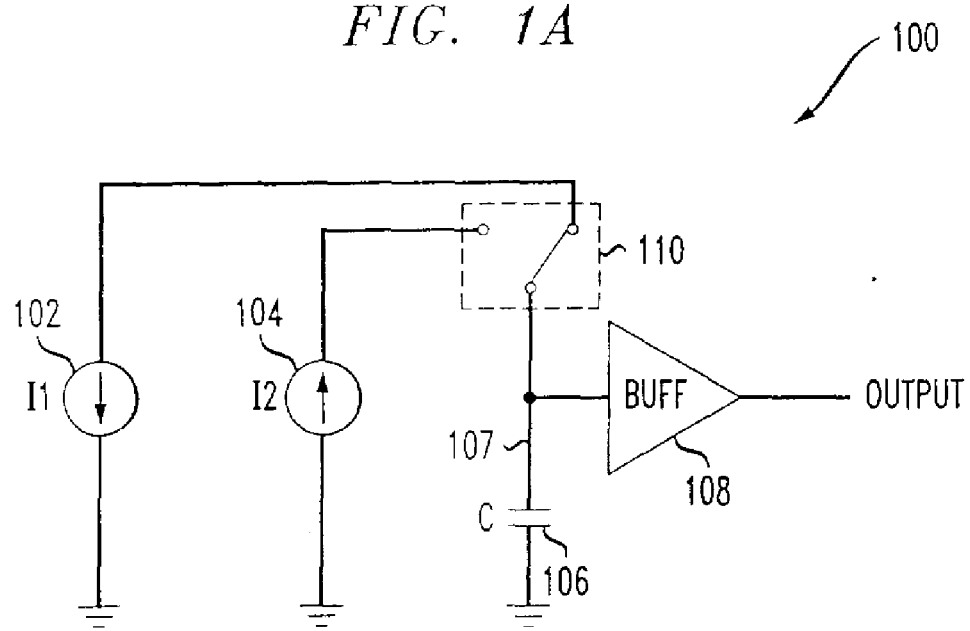
Figure 1B:
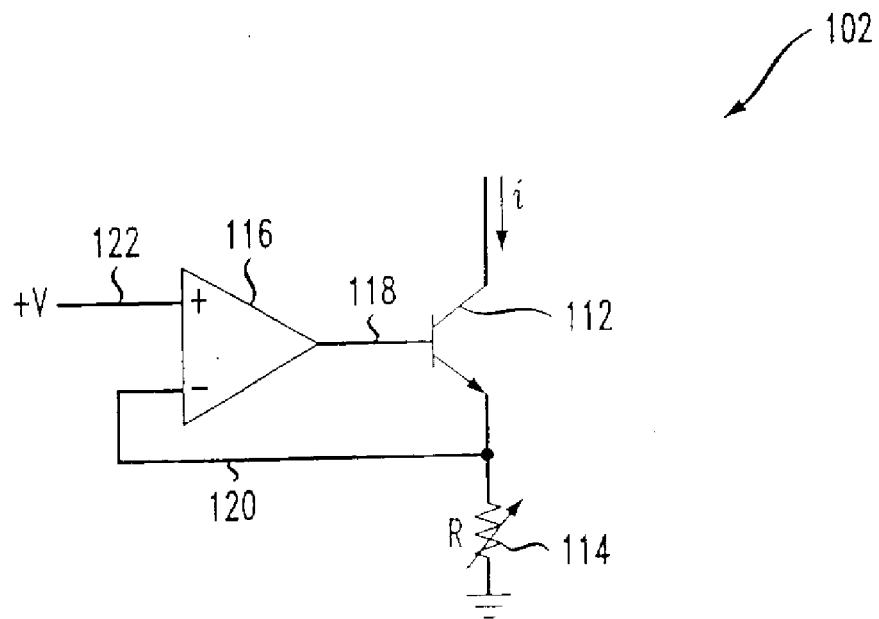
Figure 2:
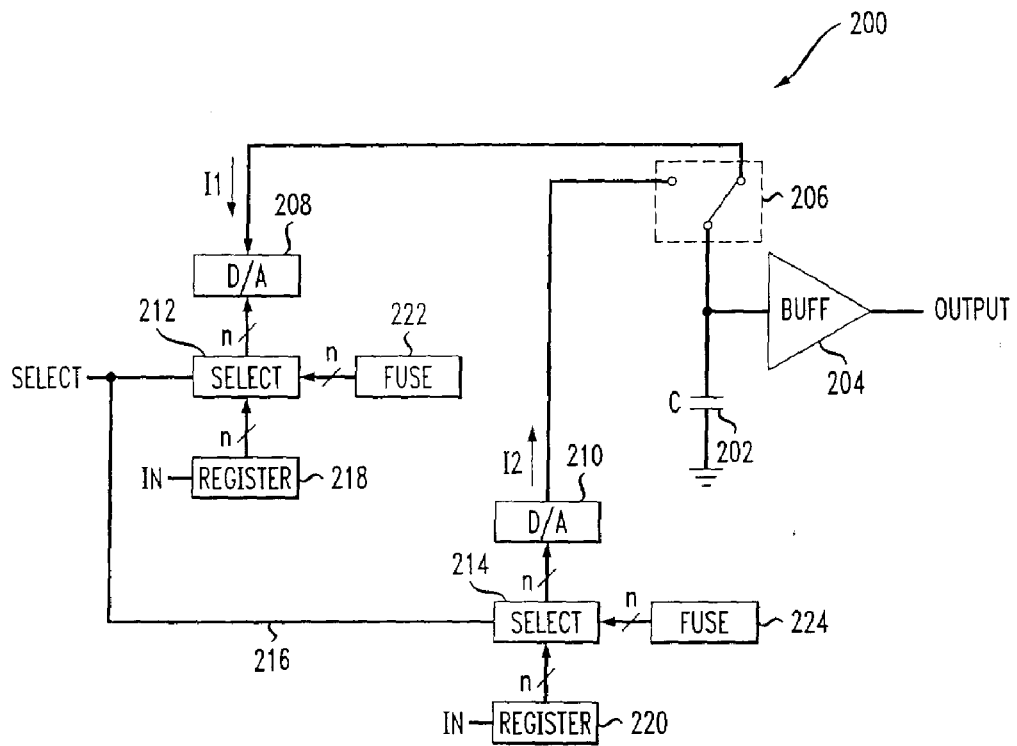

FIG. 2 illustrates a block diagram of a pin electronics driver circuit 200 for supplying input signals to a device under test (DUT) (not shown), formed in accordance with a preferred embodiment of the present invention. With reference to FIG. 2, the rate of change of a voltage generated across an output ramp capacitor 202, or slew rate (dv/dt), is preferably determined by reference sink and source currents, I1 and I2, respectively (in amperes), flowing through the capacitor 202, and the capacitance value, C, (in Farads) of capacitor 202 according to the equation $$\frac{dv}{dt} = \frac{i}{C},$$

as previously stated above. In order to provide accurate measurement capability, the pin electronics incorporated in an automated test equipment (ATE) system must have a precisely defined output slew rate. Conventionally, the output voltage slew rate of pin electronics driver circuits has been set using laser trimming methods, as discussed above. The present invention entirely eliminates the need for laser trimming by replacing the conventional reference current sink and source with digitally-programmable reference current sinks/sources, preferably implemented as a pair of digital-to-analog (D/A) converters 208, 210 respectively.

Figure 1A:
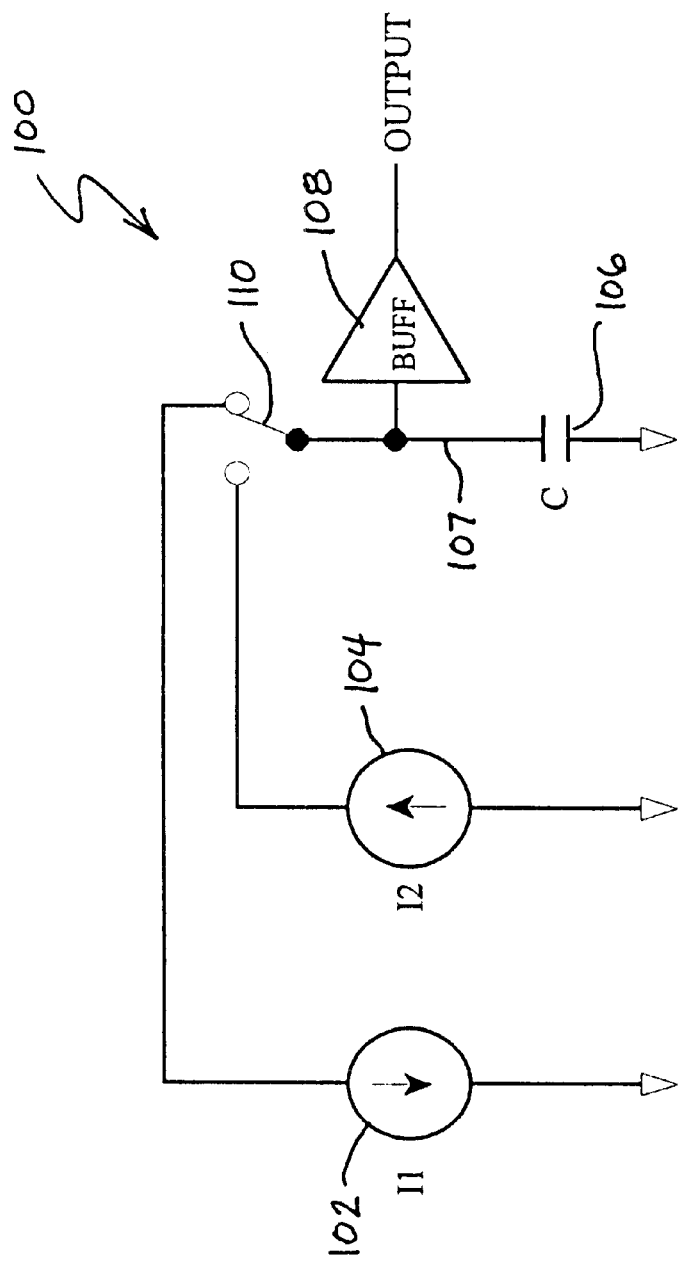
FIG. 1A is an electrical schematic diagram illustrating a conventional pin electronics driver circuit employing two ideal current sources.
Figure 1B:
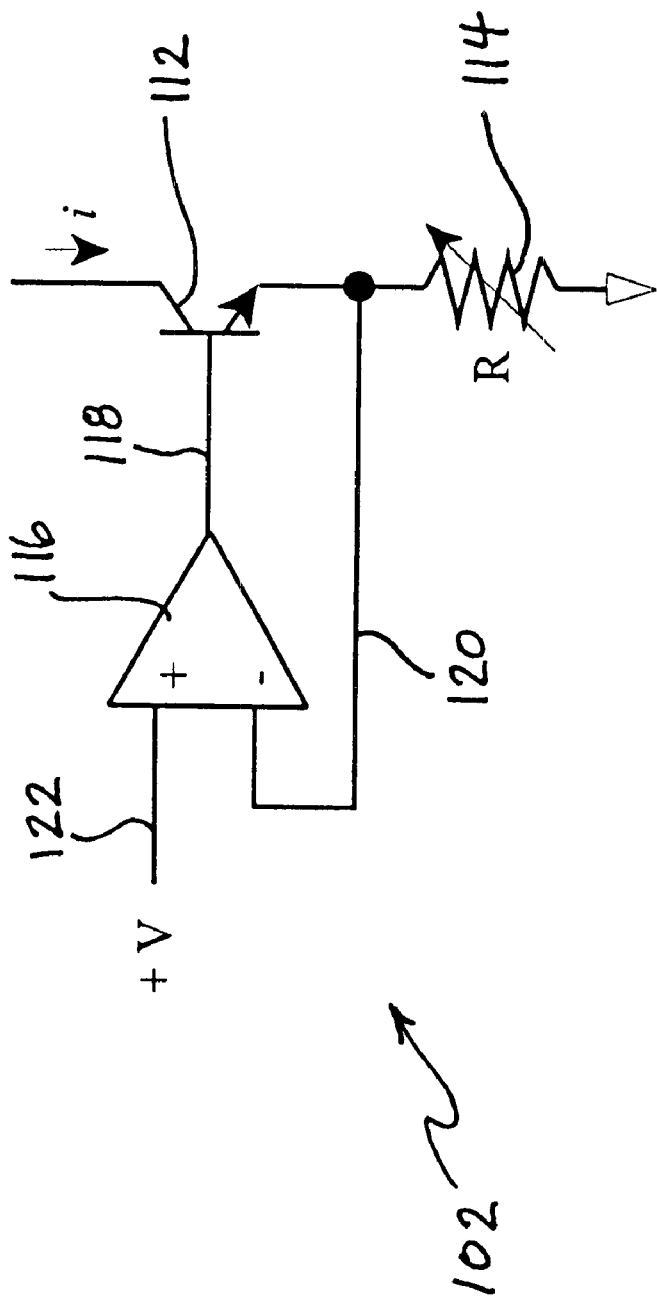
FIG. 1B is an electrical schematic diagram illustrating a conventional circuit implementation of the ideal current sources used by the pin electronics driver circuit of FIG. 1A.

Assuming the value, C, of the output capacitor 202 is within a predetermined window of tolerance (e.g., typically on the order of ±20% for integrated MOS capacitors), the slew rate can be precisely defined by adjusting the current flowing through the capacitor 202. As appreciated by those skilled in the art, a D/A converter can be viewed as a decoding device that accepts, as input, digitally coded signals and provides a corresponding analog output signal in the form of a current and/or voltage. Thus, by utilizing a D/A converter for the ideal current source/sink (see e.g., I1 or I2 in FIG. 1A), the output reference current (or voltage) can be selectively adjusted over a relatively wide predetermined range by programming the input of the D/A converter with an appropriate digital input word corresponding to the desired output. A discussion of D/A converters may be found, for example, in Alan B. Grebene, *Bipolar and MOS Analog Integrated Circuit Design,* John Wiley & Sons (1984), and therefore a detailed analysis will not be presented herein. Although the preferred embodiment shown in FIG. 2 includes two D/A converters 208, 210, each one replacing a corresponding conventional current source or sink, the present invention also contemplates an architecture (not shown) in which a single D/A converter may be employed, along with associated circuitry for controlling the direction of current flow into and out of the output ramp capacitor. Such associated circuitry will be apparent to those skilled in the art. By using two separate D/A converters for the reference current sink and source, the preferred embodiment of the present invention is able to individually adjust the positive and negative output slew rates. This would be advantageous, for example, if the positive and negative slew rates were required to be different.

The resolution of a D/A converter, typically expressed in bits, is generally defined as the smallest distinct change that can be produced at the analog output in response to a change in the digital input code. A D/A converter having n-bit resolution (i.e., accepting an n-bit digital input word) is capable of generating a total of $2^n$ discrete analog levels at the output, the levels being preferably equally spaced with respect to one another. The present invention, however, similarly contemplates alternate circuit configurations that may employ, for example, a D/A converter with logarithmically-spaced discrete output levels. Since the resolution of the D/A converter will affect the overall accuracy of the output current adjustment, it is desirable to employ a D/A converter having as great a resolution as possible. There is a tradeoff, however, in that a higher resolution D/A converter is generally more costly than its lower resolution counterpart. The necessary minimum resolution may be dictated, for instance, by the tolerance requirements specified for the output slew rate.

With continued reference to FIG. 2, the present invention preferably includes a pair of select switches 212 and 214, operatively connected to the inputs of D/A converters 208 and 210, respectively. The select switches 212, 214 are preferably implemented by an n-bit multiplexer (MUX) or suitable equivalent thereof. The digital input words to the D/A converters 208, 210 are preferably programmed and stored in a pair of corresponding data registers 218 and 220, or equivalent storage means. Each data register may be implemented as an n-bit latch or shift register which can be loaded either serially or in parallel for storing the input digital word to the D/A converters. Each select switch 212, 214 is preferably responsive to at least one input signal 216 for selectively controlling whether the n-bit digital input word to the D/A converter 208, 210 is to be read from a corresponding n-bit data register 218, 220, respectively, or from a corresponding n-bit fuse register 222, 224, respectively, operatively connected thereto. The fuse registers 222, 224 are preferably implemented as a set of fusible links that can be selectively blown to permanently store a desired input to the corresponding D/A converters 208, 210, respectively.

The data registers 218, 220 are preferably used only during testing of the pin electronics, in essence as test registers, to determine and temporarily store the correct inputs to the corresponding D/A converters 208, 210. For example, with the select switches 212, 214 configured to operatively couple the data registers 218, 220 to the D/A converters 208, 210, an automated test and measurement procedure (e.g., a software applications program running on a general purpose computer or equivalent system) may be used to concurrently program the data registers with a given digital word and then measure the resulting analog output from the D/A converters. An iterative program/measurement procedure is preferably performed until a desired output is obtained from each D/A converter 208, 210. Once the desired outputs are found, the fuse registers 222, 224 are preferably permanently programmed to provide the same digital input words to the D/A converters as are stored in the corresponding data registers 218, 220. During normal operation of the pin electronics circuit 200, the select registers 212, 214 preferably connect the fuse registers 222, 224 to their corresponding D/A converters 208, 210, respectively.

In another embodiment of the present invention, the spacing or coarseness by which the digital input signal is changed from one iterative step to the next is preferably adaptively adjusted depending on how far away the corresponding output signal is from the desired output signal. For example, for a given iterative step, the output signal is measured and a difference between the measured output value and the desired value is preferably calculated. For a subsequent iteration step, the amount by which the digital input signal is changed is preferably adjusted in response to this calculated difference. By adaptively adjusting the step size of the digital input word to the D/A converter, the amount of time, and consequently number of iterative steps, required to determine the appropriate input digital word can be reduced.

The fuse registers each preferably comprise n fusible links, with each link connected to either an internal pull-up resistor or pull-down resistor such that the digital code word output from the fuse register is at least initially either all zeros ("0") or all ones ("1"), respectively, with all fuse links short-circuited (i.e., not blown). The fuse registers 222, 224 are preferably permanently programmed by passing an excessive current through each fusible link that is required to be open-circuited or blown, much like the way a conventional circuit protection fuse is blown. Assuming pull-up resistors are used, when a fuse link has been blown, the particular bit position associated with that link preferably changes from a logic zero to a logic one (or vice versa), thus changing the input digital code to the D/A converter and causing the D/A converter associated therewith to generate a new analog output signal corresponding to the new digital input word. It is to be appreciated that the present invention additionally contemplates that the fuse registers may be implemented by a non-destructive storage device, such as an electrically-erasable programmable read only memory (EEPROM) which is programmed in a conventional manner.

In order to program the fuse registers, the pin electronics circuit 200 preferably includes one or more on-chip current sources (not shown) for supplying the current necessary to blow the fusible links. It is similarly contemplated that the current required to blow the fuse links may be supplied externally (i.e., off chip), either via an integrated circuit (IC) probe or a physical connection to an external IC pad. Additionally, control circuitry (not shown) is preferably included for directing the current through the desired link(s) to be blown, as appreciated by those skilled in the art. The control circuitry, which may be implemented as a MUX or similar device(s), preferably reads the digital word from the data registers 218, 220, once the desired input word has been found, and determines which links in the corresponding fuse registers 222, 224 should be blown in order to provide the same digital input word to the appropriate D/A converters 208, 210, respectively. In this manner, the present invention uniquely enables the reference current sink/source to be preliminarily adjusted during a test and measurement operation by successively trying various digital input words and measuring the analog output until a sufficiently accurate result is achieved, without permanently fixing the D/A converter inputs. Preferably, only after a sufficiently accurate reference output result is obtained are the fuse registers 222, 224 blown, thereby permanently storing the desired input to the D/A converters 208, 210.

It is to be appreciated that the present invention provides the ability to precisely adjust the absolute value of an output reference current and/or voltage after the semiconductor circuit has been packaged, rather than only at the wafer level. Since the output reference signal may be subjected to certain variations inherent during the packaging process itself, these errors may be effectively eliminated or at least significantly reduced by performing the precision trimming after the device has been packaged. Conventional laser trimming approaches do not allow for such post-packaging adjustment. As an additional feature of the present invention, if the select input 216 is bonded out externally to an IC pin, the fuse registers 222, 224, which permanently store a preset digital code word relating to a desired reference output current (or voltage), may be overridden such that the digital inputs to the D/A converters 208, 210 are instead read from the data registers 218, 220 associated therewith, as they are during test mode.

The present invention, as illustrated and described herein by way of an example pin electronics driver circuit, provides methods and apparatus for trimming semiconductor devices and circuits, such as pin electronics circuits used in ATE systems and the like, which do not employ a laser trimming operation. In a preferred embodiment, the present invention addresses the need to precisely adjust a reference current and/or voltage by replacing the conventional current/voltage reference source with a digitally-programmable current/voltage reference source preferably implemented by a D/A converter. A select switch having an output bit width corresponding to the D/A converter input bit width is preferably operatively coupled to the input of the D/A converter and operatively presents a digital input word to the D/A converter by selectively reading the digital word from at least one of a data register and a fuse register. The data register is preferably used only during testing of the overall current or voltage reference circuit by iteratively stepping through various digital input codes until a sufficiently accurate output signal is achieved. The fuse register is then preferably blown to permanently store the input code word that provides the desired reference output signal. During normal operation of the system, the select switch preferably reads the D/A converter input word from the fuse register. In this manner, a precise output reference output signal is achieved without the need for a laser trimming operation.

Although illustrative embodiments of the present invention have been described herein with reference to the accompanying drawings, it is to be understood that the invention is not limited to those precise embodiments, and that various other changes and modifications maybe affected therein by one skilled in the art without departing from the scope or spirit of the invention.

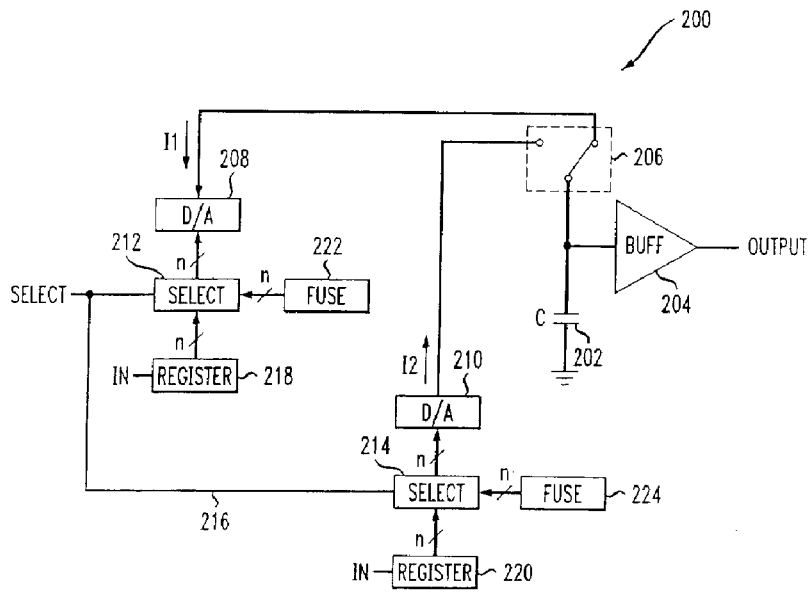

What is claimed is:

1. A method of precisely trimming a semiconductor circuit comprising the steps of:

providing the circuit with a programmable source including at least one input for receiving a digital input signal, the programmable source being responsive to the digital input signal and selectively generating a corresponding analog output signal;

in a first mode of operation of the circuit, iteratively changing the digital input signal while measuring the corresponding analog output signal until a desired output signal is achieved, the desired output signal substantially matching a predetermined value; and storing a trimmed digital input signal corresponding to the desired output signal, whereby in a second mode of operation of the circuit, the trimmed digital input signal is operatively coupled to the programmable source for generating the corresponding desired output signal;

wherein the step of iteratively changing the digital input signal comprises (i) coarsely stepping a binary representation of the digital input signal and measuring the corresponding analog output signal until the output signal is within a predefined window of the predetermined value; and (ii) finely stepping the binary representation of the digital input signal when the corresponding output signal is within the predefined window until the corresponding output signal substantially matches the predetermined value.

2. The method of claim 1, wherein the step of iteratively changing the digital input signal comprises the steps of:

at least temporarily storing the digital input signal in a data register, the programmable source being operatively coupled to the data register in the first mode of operation; and waiting a predetermined amount of time after changing the digital input signal stored in the data register until measuring the corresponding output signal from the programmable source.

3. The method of claim 1, wherein the step of storing the trimmed digital input signal comprises the step of selectively open-circuiting one or more fusible links included in a fuse register such that the trimmed digital input signal is permanently stored in the fuse register, the input of the programmable source being operatively coupled to the fuse register in the second mode of operation.

4. The method of claim 1, wherein the programmable source is a digital-to-analog converter.

5. A trimmable semiconductor device comprising:

a programmable source including at least one input for receiving a digital input signal, the programmable source being responsive to the digital input signal and selectively generating a corresponding analog output signal; and a control circuit operatively coupled to the programmable source, the control circuit generating the digital input signal and being operable in at least one of:

a first mode, wherein the control circuit iteratively changes the digital input signal while measuring the corresponding analog output signal from the programmable source until a desired output signal is achieved, the desired output signal substantially matching a predetermined value; and a second mode, wherein the control circuit fixedly stores a trimmed digital input signal corresponding to the desired output signal generated by the programmable source;

wherein the control circuit, when in the first mode of operation, is configured to iteratively change the digital input signal by: (i) coarsely stepping a binary representation of the digital input signal and measuring the corresponding analog output signal until the output signal is within a predefined window of the predetermined value; and (ii) finely stepping the binary representation of the digital input signal when the corresponding output signal is within the predefined window until the corresponding output signal substantially matches the predetermined value.

6. The semiconductor device of claim 5, further comprising:

a data register operatively connected to the control circuit and including at least one input for loading the data register with a digital word, the data register at least temporarily storing the digital word; and a fuse register operatively connected to the control circuit, the fuse register fixedly storing the digital word;

wherein the control circuit operatively connects the data register to the at least one input of the programmable source in the first mode of operation and operatively connects the fuse register to the at least one input of the programmable source in the second mode of operation.

7. The semiconductor device of claim 6, wherein the fuse register comprises a plurality of fusible links, the fusible links being selectively open-circuited to store the trimmed digital input signal.

8. The semiconductor device of claim 5, wherein the first mode is a test mode and the second mode is a normal mode.

9. The semiconductor device of claim 5, wherein the programmable source is a digital-to-analog converter.

10. The semiconductor device of claim 5, wherein the control circuit comprises:

a data register including at least one input for loading the data register with a digital word, the data register at least temporarily storing the digital word;

a fuse register including at least one input for loading the fuse register with a digital word, the fuse register fixedly storing the digital word; and a select switch including a first input operatively coupled to the data register, a second input operatively coupled to the fuse register and an output operatively coupled to the at least one input of the programmable source, the select switch further including an enable input for receiving a select input signal and selectively connecting at least one of the data register and the fuse register to the programmable source in response to the select input signal.

11. The semiconductor device of claim 10, wherein the select switch operatively connects the data register to the at least one input of the programmable source in the first mode of operation and operatively connects the fuse register to the at least one input of the programmable source in the second mode of operation.

12. A method of precisely trimming a semiconductor circuit comprising the steps of:

providing the circuit with a programmable source including at least one input for receiving a digital input signal, the programmable source being responsive to the digital input signal and selectively generating a corresponding analog output signal;

in a first mode of operation of the circuit, iteratively changing the digital input signal presented to the programmable source while measuring the corresponding analog output signal until a desired output signal is achieved, the desired output signal substantially matching a predetermined value; and storing a trimmed digital input word corresponding to the desired output signal, whereby in a second mode of operation of the circuit, the trimmed digital input word is operatively coupled to the programmable source for generating the corresponding desired output signal;

wherein the step of iteratively changing the digital input signal comprises: (i) calculating a difference between the measured analog output signal and the predetermined value for each change in the digital input signal; and (ii) adjusting a coarseness of the change in the digital input signal in response to the difference between the measured analog output signal and the predetermined value, whereby the relative coarseness of the change in the digital input signal for a subsequent iteration is adjusted as a function of the difference between the measured output signal and the predetermined value.

13. A trimmable semiconductor device comprising:

a programmable source including at least one input for receiving a digital input signal, the programmable source being responsive to the digital input signal and selectively generating a corresponding analog output signal; and a control circuit operatively coupled to the programmable source, the control circuit generating the digital input signal and being operable in at least one of:

a first mode, wherein the control circuit iteratively changes the digital input signal while measuring the corresponding analog output signal from the programmable source until a desired output signal is achieved, the desired output signal substantially matching a predetermined value; and a second mode, wherein the control circuit fixedly stores a trimmed digital input signal corresponding to the desired output signal generated by the programmable source;

wherein the control circuit, when in the first mode of operation, is configured to iteratively change the digital input signal by: (i) calculating a difference between the measured analog output signal and the predetermined value for each change in the digital input signal; and (ii) adjusting a coarseness of the change in the digital input signal in response to the difference between the measured analog output signal and the predetermined value, whereby the relative coarseness of the change in the digital input signal for a subsequent iteration is adjusted as a function of the difference between the measured output signal and the predetermined value.

* * * * *

UNITED STATES PATENT AND TRADEMARK OFFICE
CERTIFICATE OF CORRECTION

PATENT NO. : 6,433,714 B1
DATED : August 13, 2002
INVENTOR(S) : John S. Clapp et al.

It is certified that error appears in the above-identified patent and that said Letters Patent is hereby corrected as shown below:

Title page,
Delete the title page and insert the attached title page.

Drawings,
Delete Drawing Sheets 1-3 and insert the attached Drawing Sheets 1-3.

Signed and Sealed this

Twenty-second Day of October, 2002

Attest:

JAMES E. ROGAN
Attesting Officer
Director of the United States Patent and Trademark Office

United States Patent
Clapp et al.

(10) Patent No.: US 6,433,714 B1
(45) Date of Patent: Aug. 13, 2002

(54) APPARATUS AND METHOD FOR PRECISION TRIMMING OF A SEMICONDUCTOR DEVICE

(75) Inventors: John S. Clapp, Wyomissing; Glen A. Johnson, Reading; Douglas Baird Lebo, Birdsboro; Lawrence Peter Swanson, Fleetwood, all of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/746,724

(22) Filed: Dec. 20, 2000

(51) Int. Cl.⁷ .................................. H03M 1/10
(52) U.S. Cl. ........................... 341/121; 341/144
(58) Field of Search ......................... 341/121, 141, 341/133, 144, 118

(56) References Cited

U.S. PATENT DOCUMENTS

| | | | |
|---|---|---|---|
| 4,335,371 A | * 6/1982 | Connolly, Jr. et al. | 341/121 |
| 5,838,076 A | * 11/1998 | Zarrabian et al. | 307/115 |
| 6,031,672 A | * 2/2000 | Bergquist et al. | 360/46 |
| 6,232,904 B1 | * 5/2001 | Hartmann et al. | 341/145 |
| 6,307,490 B1 | * 10/2001 | Litfin et al. | 341/121 |

* cited by examiner

Primary Examiner—Peguy JeanPierre
(74) Attorney, Agent, or Firm—Ryan, Mason & Lewis, LLP

(57) ABSTRACT

The present invention provides methods and apparatus for trimming semiconductor devices and circuits, such as pin electronics circuits used in automated test equipment (ATE) systems and the like, without requiring a laser trimming operation. In a preferred embodiment, the present invention addresses the need to precisely adjust a reference current and/or voltage by replacing a conventional current/voltage reference source with a digital-to-analog (D/A) converter. A select switch or mechanism is preferably coupled to the input of the D/A converter and operatively presents a digital input word to the D/A converter by selectively reading the digital word from at least one of a data register and a fuse register. The data register is preferably used during testing of the overall current or voltage reference by iteratively trying various digital input codes while concurrently measuring the analog output signal from the D/A converter until the output signal sufficiently matches a predetermined output value. The fuse register, which comprises a plurality of fusible links, is then preferably blown to permanently store the input code word that provides the desired reference output. During normal operation of the circuit, the select switch preferably reads the D/A converter input word from the fuse register. In this manner, a precise output reference signal is achieved without the need for laser trimming.

13 Claims, 3 Drawing Sheets